(12) United States Patent
Trivedi

(10) Patent No.: US 7,210,224 B2
(45) Date of Patent: May 1, 2007

(54) METHOD FOR FORMING AN ANTIFUSE

(75) Inventor: Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 439 days.

(21) Appl. No.: 10/824,238

(22) Filed: Apr. 13, 2004

(65) Prior Publication Data

US 2004/0188800 A1 Sep. 30, 2004

Related U.S. Application Data

(60) Continuation of application No. 10/290,958, filed on Nov. 7, 2002, now Pat. No. 6,740,575, which is a division of application No. 10/211,476, filed on Aug. 1, 2002, now Pat. No. 6,683,365.

(51) Int. Cl.
*H05K 3/02* (2006.01)
*H05K 3/10* (2006.01)

(52) U.S. Cl. ............................. 29/846; 29/600; 29/825; 29/832; 29/840; 29/849; 29/852; 174/262; 438/396; 438/600

(58) Field of Classification Search .................. 29/846, 29/600, 825, 832, 840, 849, 852; 174/262; 438/396, 600
See application file for complete search history.

(56) References Cited

U.S. PATENT DOCUMENTS

| | | | |
|---|---|---|---|
| 5,300,456 A | 4/1994 | Tigelaar et al. ............. | 437/195 |
| 5,786,268 A * | 7/1998 | Gordon et al. .............. | 438/600 |
| 5,807,786 A | 9/1998 | Chang ........................ | 438/600 |
| 5,866,938 A | 2/1999 | Takagi et al. ............... | 257/530 |
| 6,185,122 B1 | 2/2001 | Johnson et al. ............. | 365/103 |
| 6,475,899 B2 | 11/2002 | Farrar ......................... | 438/622 |
| 6,486,065 B2 * | 11/2002 | Vyvoda et al. .............. | 438/690 |
| 6,541,312 B2 | 4/2003 | Cleeves et al. ............. | 438/131 |
| 6,563,188 B2 | 5/2003 | Nagatani ..................... | 257/529 |
| 6,627,530 B2 | 9/2003 | Li et al. ...................... | 438/622 |
| 6,853,049 B2 | 2/2005 | Herner ........................ | 257/529 |
| 6,888,750 B2 | 5/2005 | Walker et al. ......... | 365/185.05 |
| 2002/0025650 A1 | 2/2002 | Thakur et al. .............. | 438/398 |
| 2002/0088998 A1 | 7/2002 | Knall et al. ................. | 257/202 |
| 2003/0003633 A1 | 1/2003 | Mei et al. .................... | 438/131 |
| 2003/0081446 A1 | 5/2003 | Fricke et al. ............... | 365/105 |

\* cited by examiner

*Primary Examiner*—A. Dexter Tugbang
*Assistant Examiner*—Tim Phan
(74) *Attorney, Agent, or Firm*—Dorsey & Whitney LLP

(57) ABSTRACT

An antifuse including a bottom plate having a plurality of longitudinal members arranged substantially parallel to a first axis, a dielectric layer formed on the bottom plate, and a top plate having a plurality of longitudinal members arranged substantially parallel to a second axis, the top plate formed over the dielectric layer. Multiple edges formed at the interfaces between the top and bottom plates result in regions of localized charge concentration when a programming voltage is applied across the antifuse. As a result, the formation of the antifuse dielectric over the corners of the bottom plates enhance the electric field during programming of the antifuse. Reduced programming voltages can be used in programming the antifuse and the resulting conductive path between the top and bottom plates will likely form along the multiple edges.

10 Claims, 5 Drawing Sheets

METHOD FOR FORMING AN ANTIFUSE

CROSS-REFERENCE TO RELATED APPLICATIONS

This application is a continuation of pending U.S. patent application Ser. No. 10/290,958, filed Nov. 7, 2002 as U.S. Pat. No. 6,740,575, which is a divisional of U.S. patent application Ser. No. 10/211,476, filed Aug. 1, 2002, issued Jan. 27, 2004 as U.S. Pat. No. 6,683,365.

TECHNICAL FIELD

The present invention generally relates to integrated circuit design and fabrication, and more particularly, to an antifuse structure and method for fabricating the same.

BACKGROUND OF THE INVENTION

Fuses and antifuses are common components in conventional integrated circuits. Fuses are commonly formed from a metal or polycide layer which is narrowed down in the region of the fuse. Fuses are then typically blown by applying a voltage or laser to heat the metal or polycide above a melting point, causing the fuse to open and the conductive link. In contrast, an antifuse is a circuit element that is normally open circuited until it is programmed, at which point the antifuse assumes a relatively low resistance. Conventional antifuses are similar in construction to capacitors in that they include a pair of conductive plates separated from each other by a dielectric or insulator. Antifuses are typically characterized by the nature of the dielectric which may be, for example, oxide or nitride. Antifuses are programmed or blown by applying a differential voltage between the plates that is sufficient to break down the dielectric thereby causing the plates to electrically contact each other.

Fuses and antifuses are used in a variety of applications. One such application is to selectively enable certain features of integrated circuits. For example, semiconductor devices are often designed to be operated in multiple modes of operation, with the specific mode of operation programmed after the fabrication of the device has been completed. One method for programming the device is through the use of a fuse or antifuse. More commonly, however, fuses and antifuses are used to perform repairs of integrated circuits, such as in redundancy technology. Repairs of integrated circuits are typically accomplished by blowing the appropriate fuses or antifuses to signal defective portions of the integrated circuit that they should be replaced with redundant circuits. For example, a defective row of memory cells in the array of a dynamic random access memory (DRAM) devices can be replaced with a redundant row of cells provided for that purpose. As demonstrated by this example, redundancy technology can be used to improve the fabrication yield of high-density memory devices, such as DRAM and static random access memory (SRAM) devices, by replacing failed memory cells with spare ones using redundant circuitry activated by programming the fuses or antifuses.

As previously discussed, antifuses are similar in structure to semiconductor capacitors. Consequently, the fabrication of antifuses can be easily integrated into conventional DRAM device fabrication processes, since, as well known in the art, DRAM devices rely on semiconductor capacitors to store data. However, in devices where capacitors are not typically formed, such as in SRAM devices, integrating the fabrication of antifuses into the conventional process flow is difficult. As a result, fuses are used typically used in SRAM devices rather than antifuses.

Although fuses have been used extensively in semiconductor devices, antifuses provide several advantages over their fuse counterparts. For example, one advantage with antifuses is the ease of programming while the device is on a tester, as opposed to fuses, where the wafers must be transferred to a laser trimmer. Not only does the laser trimming process add time to the entire process, the additional step introduces another point in the process at which catastrophic mistakes can occur. For example, wafers of a lot can be accidentally trimmed using the fuse trimming profile of another lot, or wafers can be rearranged within a lot such that the reordered wafers are trimmed using the incorrect fuse trimming profile. These types of errors typically result in scrapping the mistrimmed wafers.

Additionally, as the size of semiconductor devices decreases, using lasers to blow fuses has become more difficult. That is, as semiconductor devices decrease in size and the degree of integration increases, the critical dimensions, including fuse pitch, become smaller. The availability of lasers suitable to blow the fuse becomes limited since the diameter of the laser beam should not be smaller than the fuse pitch. Thus, the fuse pitch, and the size of semiconductor devices, becomes dictated by minimum diameter of laser beams obtainable by current laser technology.

Moreover, another disadvantage with employing fuses instead of antifuses is related to conventional fuse fabrication processes. As previously discussed, conventional fuse fabrication processes typically form fuses from a polycide layer, which is deposited early in the fabrication process of the device. That is, the polycide layer from which fuses are formed is covered by multiple layers that are formed later in the processing of the device. For semiconductor devices having multiple levels of metallization, such as in SRAM devices, it is becoming very difficult to etch down through the multiple layers of oxide between the levels of metallization to expose the polycide fuses. If the oxide is not sufficiently etched, the fuses may not be completely blown by the laser trimmer, which typically results in malfunction of the device.

Therefore, there is a need for an antifuse structure and method for forming the same that can be integrated into the fabrication processes for devices that typically do not include the formation of semiconductor capacitors.

SUMMARY OF THE INVENTION

The present invention is directed to an antifuse including a bottom plate having a plurality of longitudinal members arranged substantially parallel to a first axis, a dielectric layer formed on the bottom plate, and a top plate having a plurality of longitudinal members arranged substantially parallel to a second axis, the top plate formed over the dielectric layer. The longitudinal members of the bottom plate and the top plate can be arranged orthogonally with respect to each other. The longitudinal members of the bottom plate can have at least one edge over which the dielectric material and the longitudinal members of the top plate are formed. The antifuse can further include a first interlayer, a first plurality of slots formed in the first interlayer in which the longitudinal members of the bottom plate are formed, a second interlayer formed over the first interlayer, and a second plurality of slots formed in the second interlayer in which the longitudinal members of the top plate are formed.

One aspect of the invention includes multiple edges at the interfaces between the top and bottom plates. Consequently, edges, such as the ones formed from the arrangement, result in regions of localized charge concentration when a programming voltage is applied across the antifuse. As a result, the formation of the antifuse dielectric over the corners of the bottom plates enhance the electric field during programming of the antifuse. Reduced programming voltages can be used in programming the antifuse. The resulting filament, that is, the conductive path, between the top and bottom plates will likely form along the multiple edges.

As is conventional in the field of integrated circuit representation, the lateral sizes and thicknesses of the various layers are not drawn to scale, and portions of the various layers may have been arbitrarily enlarged or reduced to improve drawing legibility.

DETAILED DESCRIPTION OF THE INVENTION

Embodiments of the present invention are directed to an antifuse structure and method for forming the same that can be integrated into fabrication processes that include a damascene local interconnect and contact formation processes. In the discussion which follows, the invention is described with reference to an SRAM memory device. However, it should be understood that the invention pertains to any applications where formation of an antifuse is desired. Additionally, in the following detailed description, reference is made to various specific embodiments in which the invention may be practiced. These embodiments are described with sufficient detail to enable those skilled in the art to practice the invention, and it is to be understood that other embodiments may be employed, and that structural and process changes may be made without departing from the teachings of the invention.

It will be appreciated that the terms "wafer" or "substrate" used in the following description may include any semiconductor-based structure that has an exposed silicon surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may have been utilized to form regions or junctions or layers in or on the base semiconductor or foundation.

Figure 1:
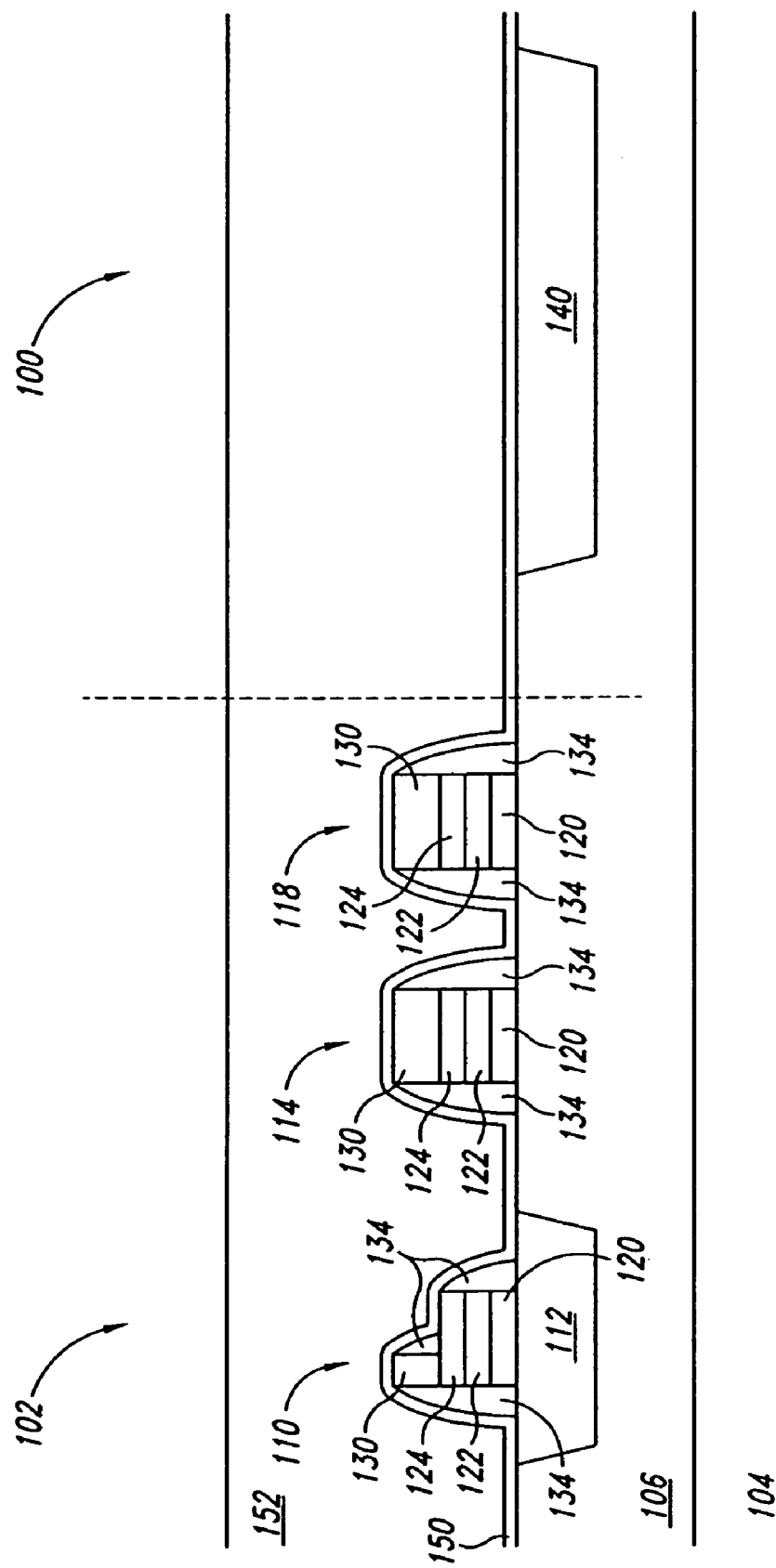
FIG. 1 is a simplified cross-sectional view of a semiconductor substrate that can be processed to form an antifuse in accordance with an embodiment of the present invention.

FIG. 1 is a simplified cross-sectional view of an antifuse region 100 shown along side a portion of an SRAM memory cell 102 at a stage of processing on a substrate 104. Although the antifuse region 100 and SRAM memory cell 102 are shown to be adjacent in FIG. 1, the antifuse region 100 is typically located outside of a memory array in which the SRAM memory cell 102 is located. The dashed line is provided to avoid any confusion over the relative location of the antifuse region 100 with respect to the SRAM memory cell 102. The antifuse region 100 and SRAM memory cell 102 are shown in FIG. 1 in this manner to illustrate the process steps in forming antifuses according to embodiments of the present invention with relation to forming an exhumed contact and local interconnect of the SRAM memory cell 102. A more detailed description of an antifuse will be provided with respect to FIGS. 2 through 5, which illustrate an antifuse and the SRAM memory cell 102 at various stages of processing.

As previously mentioned, the portion of the SRAM memory cell 102 that is shown in FIG. 1 is where an exhumed contact and local interconnect will be formed. The portion of the SRAM memory cell 102 shown in FIG. 1 includes first, second and third gate structures 110, 114, 118 formed on a doped well region 106. The well region 106 is typically doped to a predetermined conductivity, for example, p-type or n-type, depending on whether NMOS or PMOS transistors will be formed therein. Formation of the well region 106 in the substrate 104 can be accomplished using well-known semiconductor processing techniques. The gate structure 110 is formed over a shallow trench isolation (STI) structure 112. An STI structure 140 is also formed in the antifuse region 110, on which an antifuse will be formed. Each of the gate structures 110, 114, 118 includes a gate oxide 120, a gate layer 122, a conductive layer 124, and a dielectric cap 130. The gate oxide 120, the gate layer 122, the conductive layer 124, and the dielectric cap 130 can be formed using conventional processes and materials known by those of ordinary skill in the art. For example, the gate oxide 120 can be a silicon oxide material formed a thermal oxidation process, and the gate layer 122 can be formed from a doped polysilicon material deposited using conventional chemical vapor deposition (CVD) techniques, plasma-enhanced CVD (PECVD) techniques, or the like. The conductive layer 124 provides a relatively low resistance current path and can be formed from a tungsten or tungsten nitride material. Dielectric spacers 134 are formed along the sides to cover the gate oxide 120, gate layer 122, conductive layer 124 and dielectric cap 130. A tetraethyl orthosilicate (TEOS) glass material can be used for the dielectric cap 130 and the dielectric spacers 134. It will be appreciated that although specific materials and processes have been described in the present example, other suitable materials and fabrication processes can be used in forming the various layers of the gate structures 110, 114, 118, as well.

The dielectric cap 130 of the gate structure 110 has been partially removed to expose a portion of the conductive layer 124 on which the exhumed contact will be formed. An etch stop layer 150 and an interlayer 152 are formed over the SRAM memory cell 102 and the antifuse region 100. The etch stop layer 150 can be formed from a silicon nitride material and the interlayer 152 can be formed from a boron silicate glass (BSG), a borophosphorous silicate glass (BPSG), or similar material.

Figure 2:
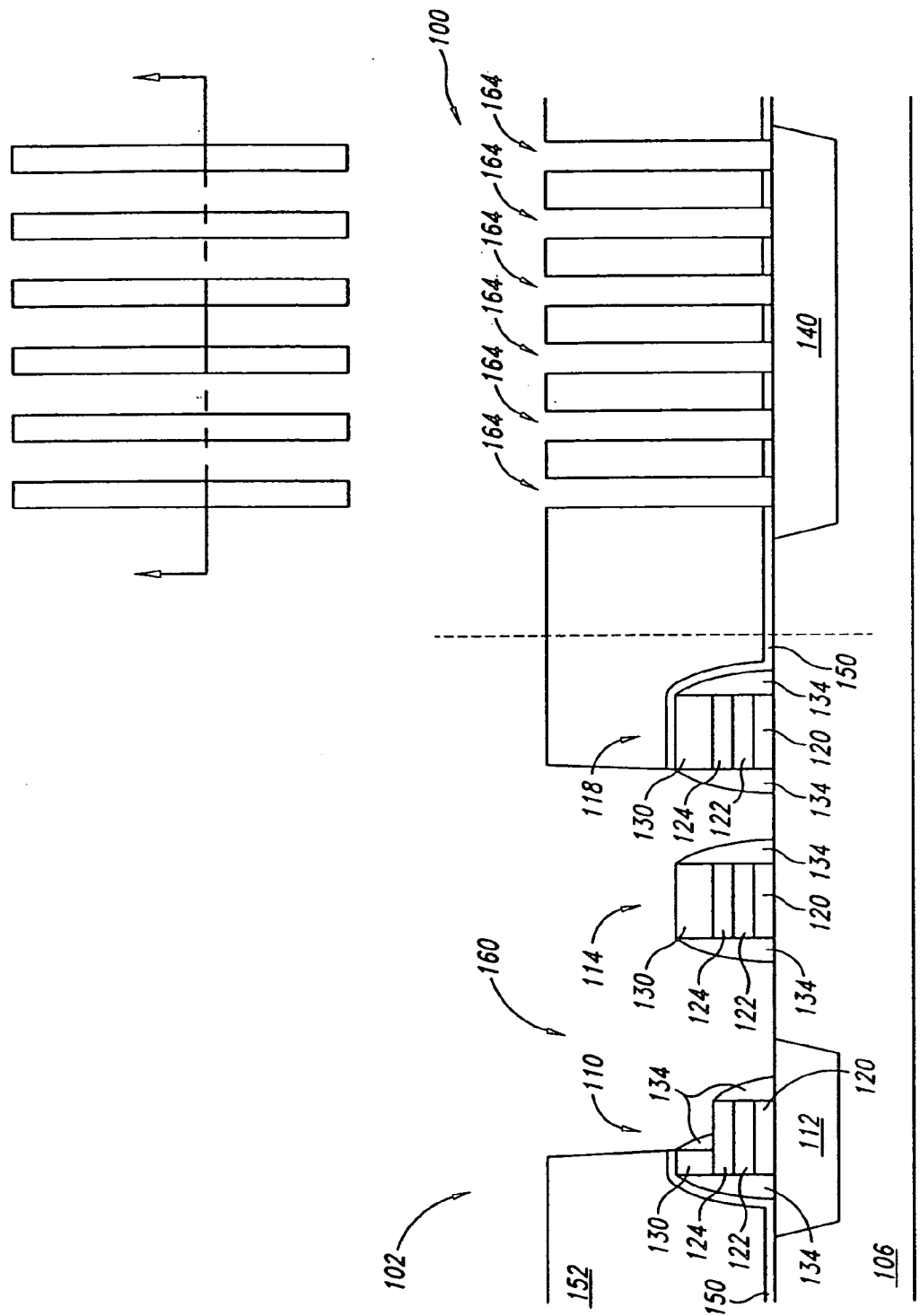
FIG. 2 is a simplified cross-sectional view of the substrate of FIG. 1 at a later point in processing, in accordance with an embodiment of the present invention.

FIG. 2 is a simplified cross-sectional view of the antifuse region 100 and the SRAM memory cell 102 (FIG. 1) at a later stage of processing. FIG. 2 includes a top plan view of the antifuse region 100. Although not shown in FIG. 2, the interlayer 152 is masked, and the interlayer 152 and the etch stop layer 150 are subsequently etched to form a exhume contact opening 160 exposing a portion of the well region 106. In the antifuse region 100, openings 164 are concurrently formed with the exhume contact opening 160. It will be appreciated that the etch processes used to etch the interlayer 152 and the etch stop layer 150 are selective to the material of the dielectric cap 130, dielectric spacers 134, and the conductive layer 124. Conventional photolithographic and etch processes can be used in the formation of the exhume contact opening 160 and the openings 164, as is well known in the art.

Figure 3:
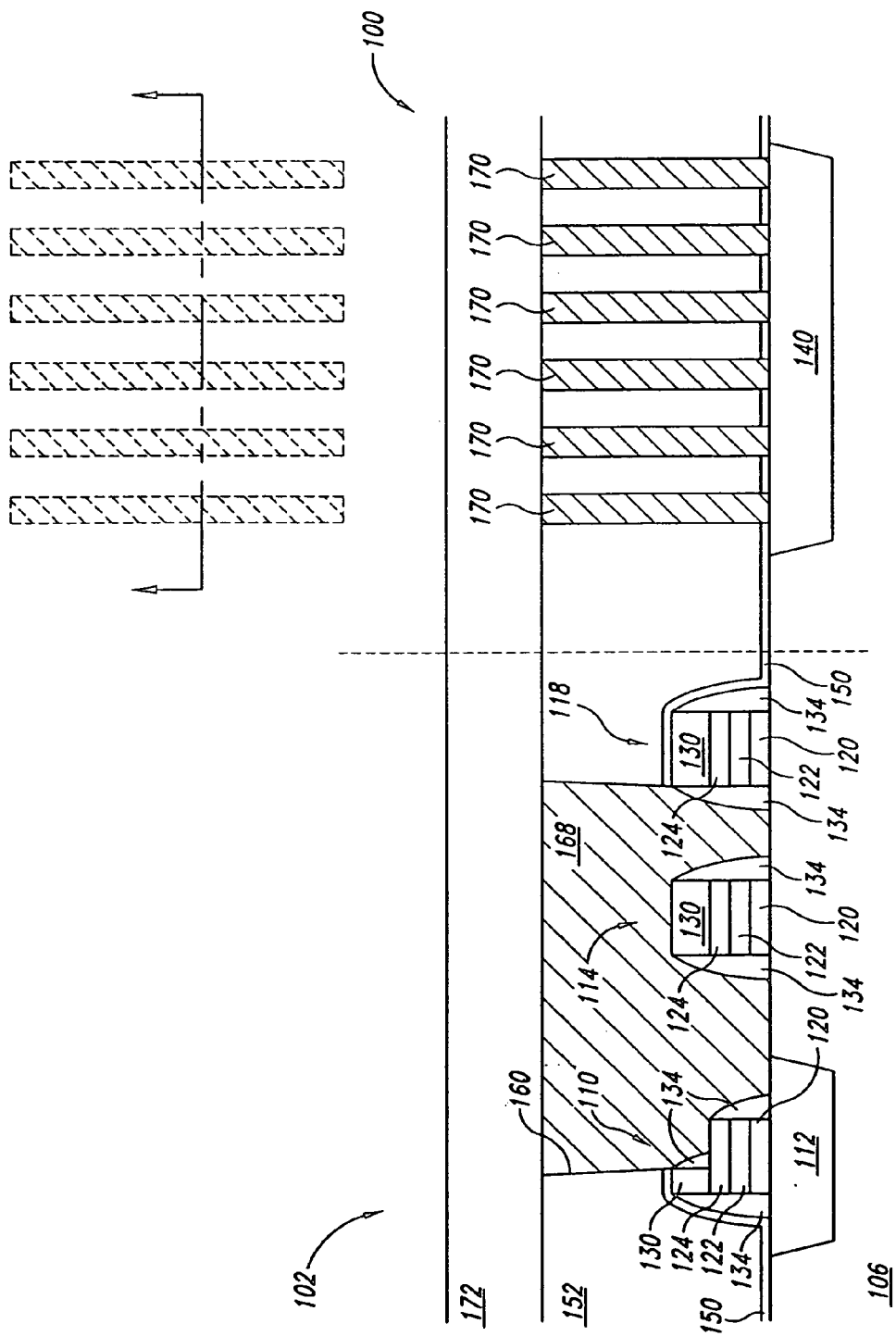
FIG. 3 is a simplified cross-sectional view of the substrate of FIG. 2 at a later point in processing, in accordance with an embodiment of the present invention.

FIG. 3 is a simplified cross-sectional view of the antifuse region 100 and the SRAM memory cell 102 (FIG. 2) at a later stage of processing. A conductive material is deposited over the interlayer 152 to fill the exhume contact opening 160 and the openings 164, and subsequently etched to remove the conductive material from the surface of the interlayer 152. As a result, a local interconnect 168 is formed in the exhume contact opening 160 and conductive plates 170 are formed in the openings 164. The local interconnect 168 is in electrical contact with the exposed portion of the conductive layer 124 of the gate structure 110. A second interlayer 172 is formed over the interlayer 152, covering the local interconnect 168 and the conductive plates 170. The second interlayer 172 can be formed from the same material from which the interlayer 152 is formed. The conductive material from which the local interconnect 168 and the conductive plates 170 are formed can be a conventional material, such as tungsten. However, it will be appreciated that other suitable materials may be used as well without departing from the scope of the present invention.

Figure 4:
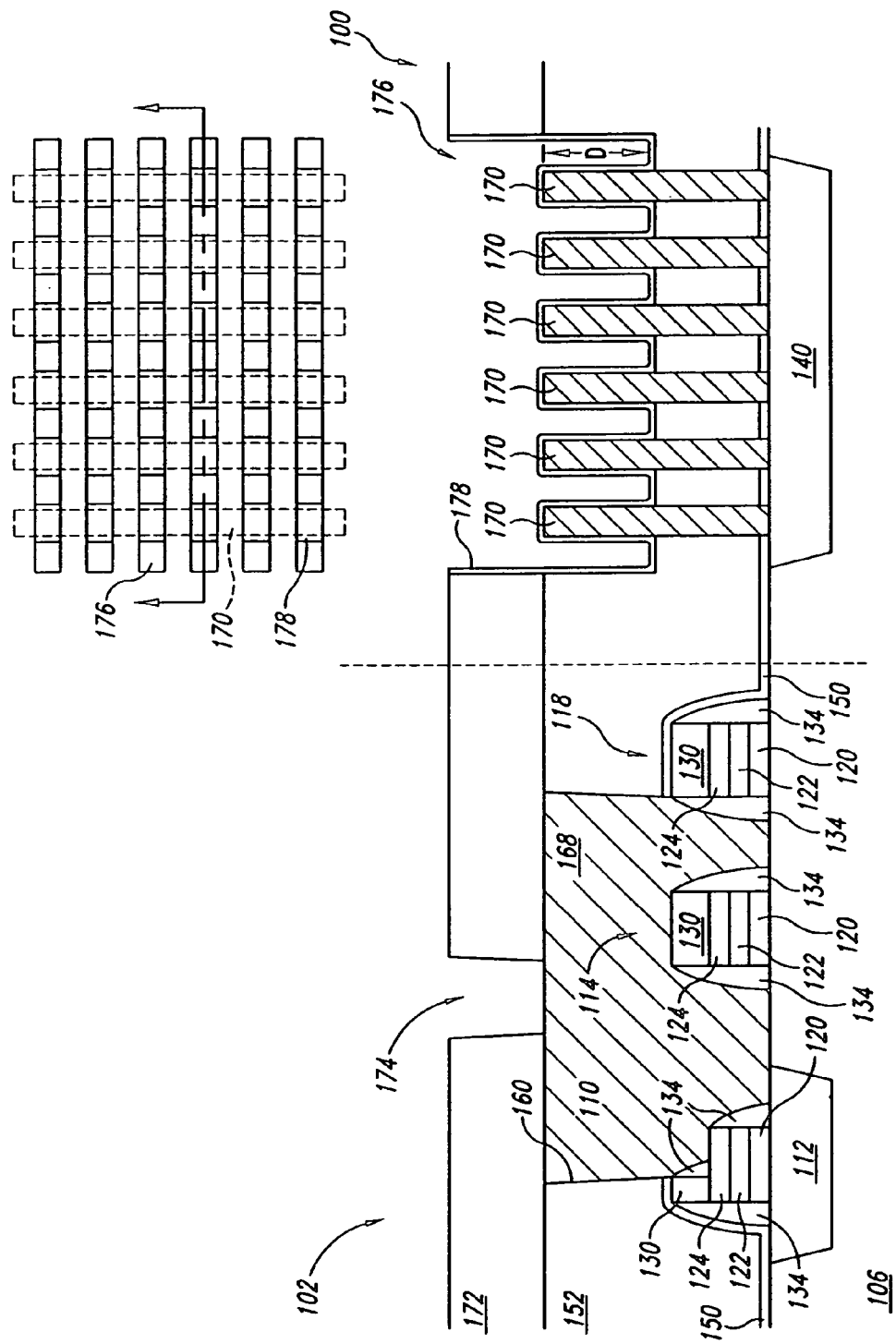
FIG. 4 is a simplified cross-sectional view of the substrate of FIG. 3 at a later point in processing, in accordance with an embodiment of the present invention.

FIG. 4 is a simplified cross-sectional view of the antifuse region 100 and the SRAM memory cell 102 (FIG. 3) at a later stage of processing. The second interlayer 172 is masked and etched to form openings 174 and 176 over the local interconnect 168 and the antifuse region 100, respectively. The openings 176 are etched generally perpendicular to the length of the conductive plates 170 to form a "crisscross" pattern. This is illustrated in the plan view included in FIG. 4. The openings 176 are etched to a depth of D below the top of the conductive plates 170. The etch process used to form the openings 174 and 176 is selective to the material from which the local interconnect 168 and the conductive plates 170 are formed. In the present example, the etch process is selective to tungsten. The second interlayer 172 is then masked to cover the SRAM memory cell 102 while leaving the openings 176 exposed. An antifuse dielectric 178 is formed over the exposed surfaces of the openings 176, including the exposed surfaces of the conductive plates 170. The antifuse dielectric 178 can be formed from conventional dielectric materials, such as silicon oxide, silicon nitride, and the like. Moreover, although the present example employs a single layer dielectric, it may be desirable to employ a multi-layer antifuse dielectric instead. Fabrication of such a dielectric structure is well known in the art.

Figure 5:
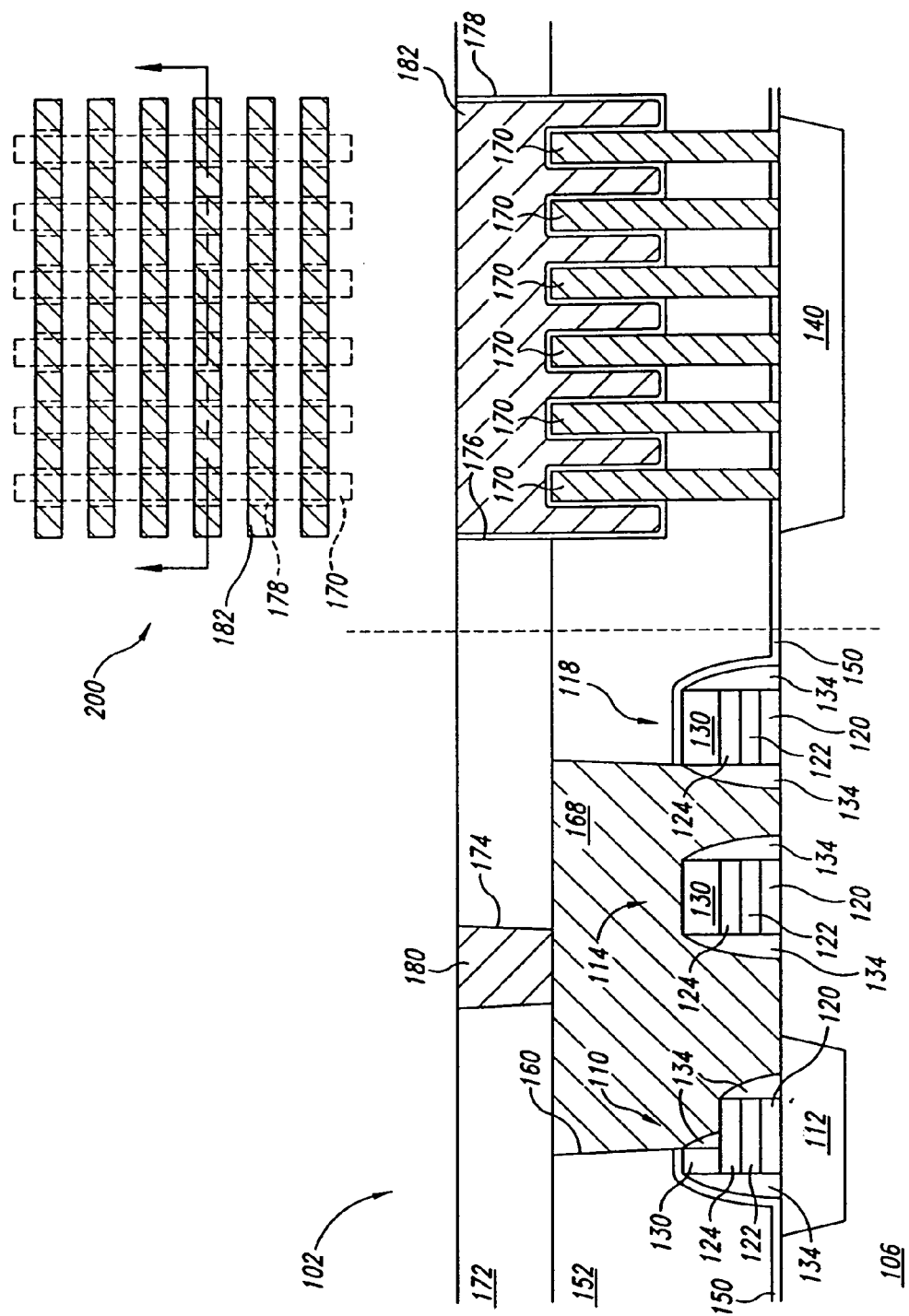
FIG. 5 is a simplified cross-sectional view of the substrate of FIG. 4 at a later point in processing, in accordance with an embodiment of the present invention.

FIG. 5 is a simplified cross-sectional view of the antifuse region 100 and the SRAM memory cell 102 (FIG. 4) at a later stage of processing. A conductive material is deposited over the second interlayer 172 to fill the openings 174 and 176, and subsequently etched to remove the conductive material from the surface of the second interlayer 172. As a result, a conductive plug 180 is formed in the opening 174, which can be used to electrically connect the local interconnect 168 to a later formed conductive interconnect (not shown). Second conductive plates 182 are also formed in the openings 176 over the antifuse dielectric 178 from the conductive material.

An antifuse 200 is formed from the orthogonally arranged conductive plates 170 and 182, and the antifuse dielectric 178. Although not shown in FIGS. 1–5, the antifuse 200 is electrically coupled to a conventional antifuse programming circuit. As well known in the art, the antifuse programming circuit is used to program the antifuse 200 when desired. A conventional sensing circuit may also be electrically coupled to the antifuse 200 as well where sensing the programmable state of the antifuse is desired. Such circuits are well known in the art, and will not be discussed in detail herein in order to avoid obscuring the present invention.

It will be appreciated that the arrangement of the antifuse 200 shown in FIG. 5 provides multiple edges at the interfaces between the first conductive plates 170, the antifuse dielectric 178, and the second conductive plates 182. As well known in the art, edges, such as the ones formed from the arrangement of the present example, result in regions of localized charge concentration when a voltage is applied across the antifuse dielectric 178. As a result, the orthogonal corner formation of the antifuse dielectric 178 with the first and second conductive plates 170, 182 enhances the electric field during programming of the antifuse 200. Consequently, reduced programming voltages can be used. The resulting filament, that is, the conductive path, between the first and second conductive plates 170, 182 will consistently form along the edges.

The arrangement of embodiments of the present invention also provide the ability to adjust the magnitude of the programming voltage by designing the grid of the first and second conductive plates 170, 182 with fewer or greater conductive crisscrossing plates. That is, the programming voltage for antifuses on a device can be tailored to the specific use, with some antifuses having a higher or lower programming voltage than other antifuses, if so desired. Moreover, fabrication of antifuses according to embodiments of the present invention can be easily integrated into with processes including a damascene local interconnect and contact formation processes, such as in the example of the SRAM memory cell 100 provided above.

From the foregoing it will be appreciated that, although specific embodiments of the invention have been described herein for purposes of illustration, various modifications may be made without deviating from the spirit and scope of the invention. For example, the previously discussed embodiment includes arranging the first and second conductive plates 170, 182 orthogonally with respect to one another. However, it will be appreciated that the arrangement of the first and second conductive plates 170, 182 can be modified such that the orientation is other than perpendicular. Accordingly, the invention is not limited except as by the appended claims.

The invention claimed is:

1. A method for forming an antifuse, comprising:
   forming a first interlayer;
   forming a first plurality of slots in the first interlayer;
   forming a first electrode having a plurality of vertically oriented rectangular plates in the first plurality of slots;
   forming a second interlayer over the first interlayer;
   forming a second plurality of slots in the second interlayer;
   forming a second electrode in the second plurality of slots, the second electrode having a plurality of longitudinal members, the plurality of longitudinal members of the second electrode arranged substantially orthogonally with respect to the plurality of vertically oriented rectangular plates of the first electrode, the second electrode overlying the first electrode and having portions extending between the plurality of vertically oriented rectangular plates; and forming a dielectric interposed between at least portions of the first and second electrodes.

2. The method of claim 1 wherein forming the first electrode having a plurality of vertically oriented rectangular plates comprises forming a plurality of longitudinal members having at least one edge on which the dielectric and the longitudinal members of the second electrode are formed.

3. The method of claim 2 wherein each of the vertically oriented rectangular plates of the first electrode have a rectangular profile.

4. The method of claim 1, further comprising forming an isolation region on which the first electrode is formed.

5. The method of claim 4 where in the first and second electrodes are formed from a tungsten material.

6. A method for forming an antifuse, comprising:
forming a first interlayer;
forming a first plurality of slots in the first interlayer;
forming a first electrode in the first plurality of slots, the first electrode having a plurality of vertically oriented rectangular plates;
forming a second interlayer over the first interlayer;
forming a second plurality of slots in the second interlayer;
forming a second electrode in the second plurality of slots, the second electrode having a second plurality of parallel conductive members formed over the first electrode and intersecting the first plurality of conductive members; and
forming a dielectric interposed between at least portions of the first and second electrodes.

7. The method of claim 6 wherein forming the first electrode having a plurality of vertically oriented rectangular plates comprises forming a plurality of conductive members having at least one edge on which the dielectric and the conductive members of the second electrode are formed.

8. The method of claim 7 wherein each of the conductive members of the first electrode have a rectangular profile.

9. The method of claim 6, further comprising forming an isolation region on which the first electrode is formed.

10. The method of claim 9 where in the vertically oriented rectangular plates of the first electrode and the parallel conductive members of the second electrode are formed from a tungsten material.

* * * * *